US009123553B2

(12) United States Patent
Liu et al.

(10) Patent No.: US 9,123,553 B2
(45) Date of Patent: Sep. 1, 2015

(54) METHOD AND SYSTEM FOR BONDING 3D SEMICONDUCTOR DEVICE

(75) Inventors: Chung-Shi Liu, Hsin-Chu (TW);
Chen-Hua Yu, Hsin-Chu (TW);
Yuh-Jier Mii, Hsin-Chu (TW);
Yuan-Chen Sun, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 804 days.

(21) Appl. No.: 13/269,260

(22) Filed: Oct. 7, 2011

(65) Prior Publication Data
US 2012/0028441 A1 Feb. 2, 2012

Related U.S. Application Data

(62) Division of application No. 11/789,617, filed on Apr. 25, 2007, now Pat. No. 8,048,717.

(51) Int. Cl.
| | |
|---|---|
| *H01L 21/00* | (2006.01) |
| *H01L 25/065* | (2006.01) |
| *H01L 21/683* | (2006.01) |
| *H01L 21/768* | (2006.01) |
| *H01L 23/00* | (2006.01) |
| *H01L 25/00* | (2006.01) |

(52) U.S. Cl.
CPC ........ *H01L 25/0657* (2013.01); *H01L 21/6835* (2013.01); *H01L 21/6836* (2013.01); *H01L 21/76898* (2013.01); *H01L 24/95* (2013.01); *H01L 24/97* (2013.01); *H01L 25/50* (2013.01); *H01L 2221/68327* (2013.01); *H01L 2221/68354* (2013.01); *H01L 2224/16* (2013.01); *H01L 2224/32145* (2013.01); *H01L 2224/48091* (2013.01); *H01L 2224/48227* (2013.01); *H01L 2224/48472* (2013.01); *H01L 2224/73265* (2013.01); *H01L 2225/06513* (2013.01);

(Continued)

(58) Field of Classification Search
CPC ............... H01L 21/02052; H01L 21/02631; H01L 21/02658; H01L 21/31138; H01L 21/31604; H01L 21/32136; H01L 21/6702; H01L 21/6835; H01L 21/68358; H01L 21/76826; H01L 21/76883; H01L 21/76862; H01L 21/76864
USPC ............. 438/51, 64, 107, 109, 110, 113, 118, 438/455, 458, 459, 460, 464
See application file for complete search history.

(56) References Cited

U.S. PATENT DOCUMENTS

| | | | |
|---|---|---|---|
| 4,678,661 A | 7/1987 | Gergely et al. | |
| 6,627,556 B1 * | 9/2003 | Aronowitz et al. | ........... 438/710 |

(Continued)

*Primary Examiner* — Kyoung Lee
*Assistant Examiner* — Joannie A Garcia
(74) *Attorney, Agent, or Firm* — Slater & Matsil, L.L.P.

(57) ABSTRACT

A method and system and for fabricating 3D (three-dimensional) SIC (stacked integrated chip) semiconductor devices. The system includes a vacuum chamber, a vacuum-environment treatment chamber, and a bonding chamber, though in some embodiments the same physical enclosure may serve more than one of these functions. A vacuum-environment treatment source in communication with the vacuum-environment treatment chamber provides a selected one or more of a hydrogen ($H_2$)-based thermal anneal, an $H_2$-based plasma treatment, or an ammonia ($NH_3$)-based plasma treatment. In another embodiment, a method includes placing a semiconductor chip in a vacuum environment, performing a selected vacuum-environment treatment, and bonding the chip to a base wafer. A plurality of chips formed as dice on a semiconductor wafer may, of course, be simultaneously treated and bonded in this way as well, either before or after dicing.

20 Claims, 6 Drawing Sheets

(52) U.S. Cl.
CPC .............. *H01L2225/06541* (2013.01); *H01L 2924/01006* (2013.01); *H01L 2924/01015* (2013.01); *H01L 2924/01029* (2013.01); *H01L 2924/01032* (2013.01); *H01L 2924/01033* (2013.01); *H01L 2924/14* (2013.01)

(56) References Cited

U.S. PATENT DOCUMENTS

| | | | |
|---|---|---|---|
| 6,822,308 B2* | 11/2004 | Aronowitz et al. | 257/501 |
| 7,589,008 B2 | 9/2009 | Kirby | |
| 2001/0042598 A1 | 11/2001 | Yamada et al. | |
| 2002/0052124 A1* | 5/2002 | Raaijmakers et al. | 438/778 |
| 2002/0155632 A1* | 10/2002 | Yamazaki et al. | 438/29 |
| 2003/0032292 A1* | 2/2003 | Noguchi | 438/692 |
| 2003/0235988 A1* | 12/2003 | Aronowitz et al. | 438/689 |
| 2004/0142540 A1 | 7/2004 | Kellar et al. | |
| 2005/0003650 A1 | 1/2005 | Ramanathan et al. | |
| 2007/0128827 A1 | 6/2007 | Faris | |
| 2007/0166997 A1 | 7/2007 | Knorr | |
| 2007/0181255 A1 | 8/2007 | Hayasaka et al. | |
| 2007/0190690 A1 | 8/2007 | Chow et al. | |
| 2007/0196966 A1 | 8/2007 | Iwasawa | |
| 2008/0061402 A1* | 3/2008 | Ishihara et al. | 257/621 |
| 2009/0104775 A1* | 4/2009 | Gonohe et al. | 438/680 |

* cited by examiner

METHOD AND SYSTEM FOR BONDING 3D SEMICONDUCTOR DEVICE

This application is a divisional of U.S. patent application Ser. No. 11/789,617, filed on Apr. 25, 2007, entitled "Method and System for Bonding 3D Semiconductor Devices," which application is hereby incorporated herein by reference in its entirety.

TECHNICAL FIELD

The present invention relates generally to the fabrication of semiconductor devices, and related more particularly to a system and method for bonding together the separate chips in a 3D (three-dimensional) semiconductor device such as a 3D-SIC (stacked integrated circuit) SIP (system in package) device.

BACKGROUND

Modern electronic appliances are frequently manufactured using one or more packaged semiconductor devices, which are sometimes called chips, each enclosed in a familiar black plastic package or in some other type of protective enclosure. Each chip performs a specific function associated with the operation of electronic appliance, and is mounted on one or more printed wired boards (PWBs) that provide for mechanical support and for electrical connections between the various chips. The PWBs and one or more input and output devices such as keyboards or LCD screens are then secured in some type of housing. Examples of modern electronic appliances include mobile telephones, personal digital assistants, and personal gaming devices. Larger electronic appliances include personal computers and television sets.

A chip is, generally speaking, a small piece of semiconductor material onto which a large number of tiny electric components have been fabricated and connected with one another to form integrated circuits. An example is shown in FIG. 1. FIG. 1 is a simplified perspective view illustrating a typical semiconductor chip 10. As can be seen in FIG. 1, semiconductor chip 10 is thin and usually in the shape of a square or rectangle. On the top surface 11 of semiconductor chip 10 is an active area 12. Active area 12 is simply the portion of top surface 11 at which the many tiny electrical components (not shown) are located. In this particular example, active area 12 also includes a series of bond pads 13, which are basically larger, externally-accessible conductive pads to which exterior electrical connections may be made, for example by attaching a bond wire (see FIG. 3). A seal ring 14 is formed on surface 11 of semiconductor chip 10 about the periphery of active area 12, segregating it from the rest of the chip and providing protection during certain fabrication operations. The backside 15 of chip 10 is referenced but not visible in FIG. 1. Ordinarily there are no circuits or pads formed on the backside 15, although there may be in some applications.

For efficiency, the electronic components for a number of chips are often fabricated simultaneously. For this purpose a thin wafer may be sliced from an ingot of, for example, silicon, and treated by ion implantation to impart semiconductor properties. An example is shown in FIG. 2. FIG. 2 is a plan view illustrating a typical semiconductor wafer 20. For the purpose of illustration, chip 10 is pointed out, although at this stage it has not yet been separated from the other, adjacent devices, and is typically referred to as a die. As can be seen in FIG. 2, a plurality of dice 22 is often formed in an array on the surface 21 of wafer 20. The dice 22 are collectively fabricated in a series of process steps that, in general, selectively deposit and selectively remove layers of insulating, conductive, and semiconductor material. Much of this process is automated, and great precision is required. An orientation notch 23 is for this reason formed in the periphery of wafer 20 so that it's proper positioning may be confirmed. Other methods of orientation control are used as well. Inspection and various types of testing take place at certain points in the fabrication process to identify those dice containing irremediable defects so that they are not used. Each of the dice 22 are usually though not necessarily identical with respect to each other, and will later in the fabrication process be separated into individual chips, such as the chip 10 shown in FIG. 1. The process for separating the chips is sometimes referred to as dicing.

As mentioned above, the various chips mounted on a given PWB (not shown) are often interconnected, and may in that manner form systems intended to perform an overall function, or set of functions, with each chip performing its own function-associated tasks. As small, energy-efficient electronic appliances become more popular, however, there arises a demand for new ways to configure the systems on which they rely. The chips forming an entire system, for example, may be contained within a single package. An exemplary SIP (system in package) device is shown in FIG. 3.

FIG. 3 is a simplified perspective view illustrating an exemplary 3D (three-dimensional)-SIC (stacked integrated circuit) semiconductor device 30. As should be apparent, this device consists of three chips that have been mounted one on top of the other. Semiconductor chip 10 shown in FIG. 1 is in this example at the top of the three-chip stack. Semiconductor chip 31 is directly beneath it, and semiconductor chip 32 is beneath a semiconductor chip 31. An intermediate layer 33 is shown between chip 31 and chip 32, and intermediate layer 34 is shown between chip 31 and chip 10. These intermediate layers are typically some type of insulating material that may also serve to bond the chips together. When assembled, the entire device 30 may be encased in this or a similar material, though this is not shown in FIG. 3. Semiconductor chip 10 is the smallest of the three chips in device 30, and semiconductor chip 31 the largest, permitting the numerous electrical connections required between the chips to be made using bond wires 35. As should be apparent, this is a very simplified illustration; an actual device may have dozens of such bond wires. Alternative means of providing electrical connections may also be used, for example creating vertical conductive structures that connect components on one chip with components on another, usually adjacent chip.

Unfortunately, when using vertical conductive structures to make connections between the components of one semiconductor device and those of another, problems in bonding may occur. The processes used to prepare one chip for bonding with another, such as grinding and polishing, often leave behind chemical residue and deleterious material that interferes with the bonding process. In addition, if too much time is allowed to elapse between preparation and bonding, oxidation or corrosion may degrade the quality of the exposed conductors. Eliminating this delay (sometimes referred to as Queue-time, or simply Q-time), however, may impose addition costs or other undesirable consequences. Needed, then, is a manner of manufacturing semiconductor devices such as 3D-SICs, and in particular preparing the multiple chips involved for bonding, which provides for greater bonding reliability and permits longer Q-times. The present invention provides just such a solution.

SUMMARY OF THE INVENTION

These and other problems are generally solved or circumvented, and technical advantages are generally achieved, by preferred embodiments of the present invention directed to fabrication of a 3D (three-dimensional) SIC (stacked integrated circuit) semiconductor device. In accordance with a preferred embodiment of the present invention, a method for fabricating a semiconductor device includes forming a plurality of dice on a semiconductor wafer, placing the wafer in a vacuum chamber and drawing a vacuum, performing a selected vacuum-environment treatment, and then bonding the semiconductor wafer to a base semiconductor wafer, preferably while maintaining the vacuum environment. In accordance with the present invention, the selected vacuum-environment treatment includes one or more of a hydrogen ($H_2$)-based thermal anneal, an $H_2$-based plasma treatment, or an ammonia ($NH_3$)-based plasma treatment. In some embodiments, a chemical dip may be performed prior to the vacuum-environment treatment, preferably using a citric acid or, alternately, a hydrochloric acid (HCl) bath.

In another aspect, the present invention is a method of preparing semiconductor chip for bonding, comprising performing a vacuum-environment treatment of the chip while it is in a vacuum or reduced-pressure environment. These may be performed in two chambers, the first for loading the wafer and drawing a vacuum, the second for performing the vacuum-environment treatment itself. The chip in this instance is preferably transferred from the first chamber to the second chamber without breaking vacuum. A third chamber may then be used for bonding the chip to a base wafer, or simply to another chip. In one preferred embodiment, a chemical dip is performed prior to the vacuum-environment treatment.

An advantage of preferred embodiments of the present invention is that oxidation of the exposed conductive material is reduced and undesirable moisture and chemical residue is largely or completely expelled. This generally provides for better adhesion and, as a result, better bonding stability.

A further advantage of a preferred embodiment of the present invention is that process Q-time is prolonged, easing time constraints otherwise present in the fabrication process without incurring significant additional cost.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a 3D (three-dimensional) SIC (stacked integrated circuit) semiconductor device. The invention may also be applied, however, to other semiconductor devices as well. As mentioned above, the present invention is directed to a method and system for providing longer Q-times at certain stages of the chip manufacturing process, and for reducing the risk of bonding failure by reducing the amount of moisture and residual chemicals remaining on the bonding surface after preparation for bonding. A system and methods according to the present invention will now be described.

Figure 4:
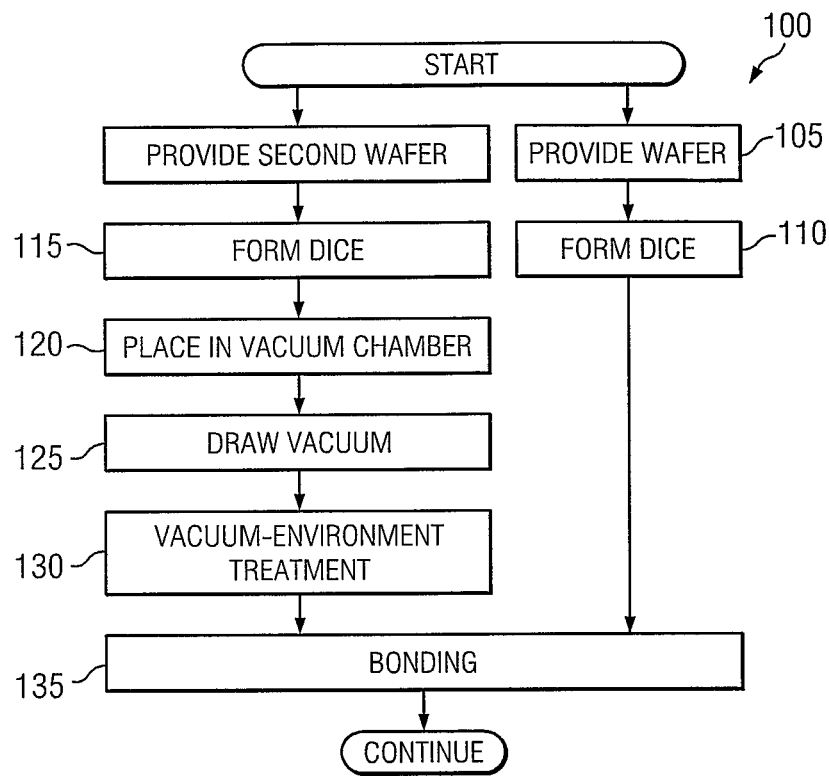
FIG. 4 is a flow diagram illustrating a method for fabricating a semiconductor device according to an embodiment of the present invention.

FIG. 4 is a flow diagram illustrating a method 100 for fabricating a semiconductor device according to an embodiment of the present invention. At START, it is presumed that the materials and equipment necessary to performing the method are available and operational. This process then begins with providing a wafer (step 105). The wafer may be formed, for example, of silicon or silicon-germanium, although other materials may be used. A plurality of dice is then formed on at least one surface of the wafer (step 110). A plurality of dice is also formed on a second wafer (step 115). The second semiconductor wafer is then placed in a vacuum chamber (step 120) and a vacuum is drawn (step 125). In a preferred embodiment, the vacuum drawn in the chamber corresponds to a pressure differential of about 1 mTorr compared with atmospheric pressure.

In accordance with this embodiment of the present invention, a vacuum-environment treatment is then performed (step 130). Note that as used herein, the term "vacuum-environment treatment" denotes that a selected treatment is performed while the second wafer is in a vacuum environment. The selected treatment includes one or more of hydrogen (H2)-based thermal anneal, an H2-based plasma treatment, or an ammonia (NH3)-based plasma treatment. The performance of one or more of such treatment does not preclude, of course, the performance of other operations while the second wafer is in the vacuum environment.

The second semiconductor wafer and the first semiconductor wafer are then bonded together (step 135). The bonding may be performed, for example, by aligning the two wafers appropriately, forcing them together with some force, and heating the assembly until certain intended components, such as copper conductors, have been joined together. Variations on this bonding operation are used in some alternate embodiments. The bonding operation, however, is preferably performed while the wafer assembly is in a vacuum environment. This implies, of course, that at some point the first semiconductor wafer be introduced to the vacuum environment where the second semiconductor wafer is located. It is preferred, however, that the second semiconductor wafer be kept in a vacuum environment throughout the process.

Figure 5:
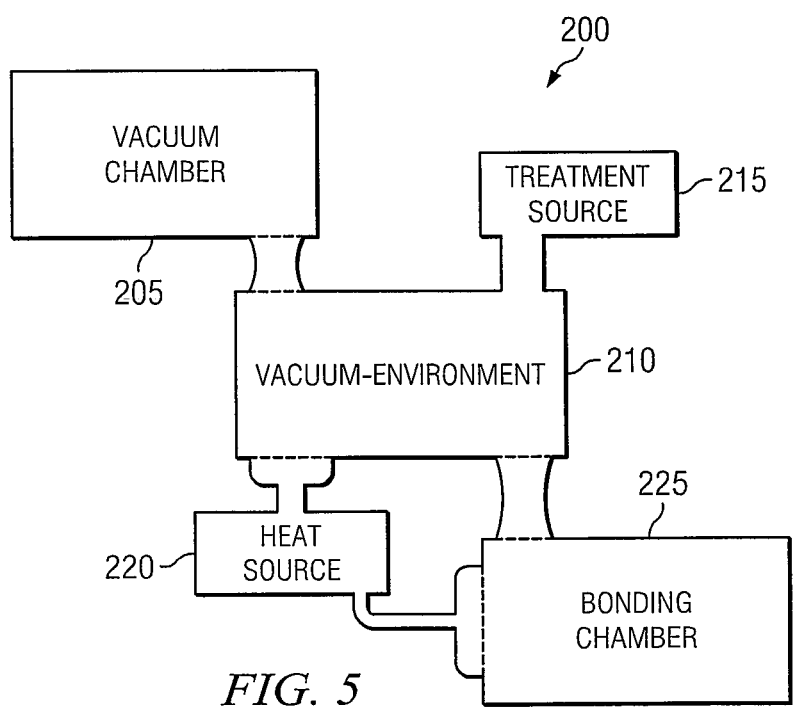
FIG. 5 is a simplified schematic diagram illustrating a system according to an embodiment of the present invention.

In another embodiment, the present invention is a system for fabrication of a 3D-SIC semiconductor device. FIG. 5 is a simplified schematic diagram illustrating a system 200 according to an embodiment of the present invention. In this embodiment, system 200 includes a vacuum chamber 205 for producing a reduced-pressure environment. A vacuum-environment treatment chamber 210 is preferably in communication with vacuum chamber 205 so that one or more semiconductor chips or wafers placed in the reduced-pressure environment remain under vacuum continuously throughout this portion of the fabrication process. A vacuum-environment treatment source 215 is in communication with, or enclosed within, the vacuum-environment treatment chamber 210, and provides the materials necessary for the selected vacuum-environment treatment at the appropriate time and in the appropriate manner. A heat source 220 is present in this embodiment to raise the environmental temperature as necessary, but is not needed for all applications. Finally, a bonding chamber 225 is present, and preferably in communication with vacuum-environment treatment chamber 210 so that the wafer or chip being treated remains under vacuum throughout this portion of the process. Heat source 220 may also provide an elevated temperature for bonding as well, and in this embodiment is for this reason in communication with bonding chamber 225 as well. Alternately, a separate heat source (not shown) may be used instead.

Note that in the embodiment of FIG. 5, three separate chambers are shown. In other embodiments (not shown) a particular physical chamber may be used for performing additional operations. By the same token, additional components or treatment chambers may in some alternate embodiments be added to those shown in FIG. 5 while remaining within the spirit of the present invention.

Figure 6:
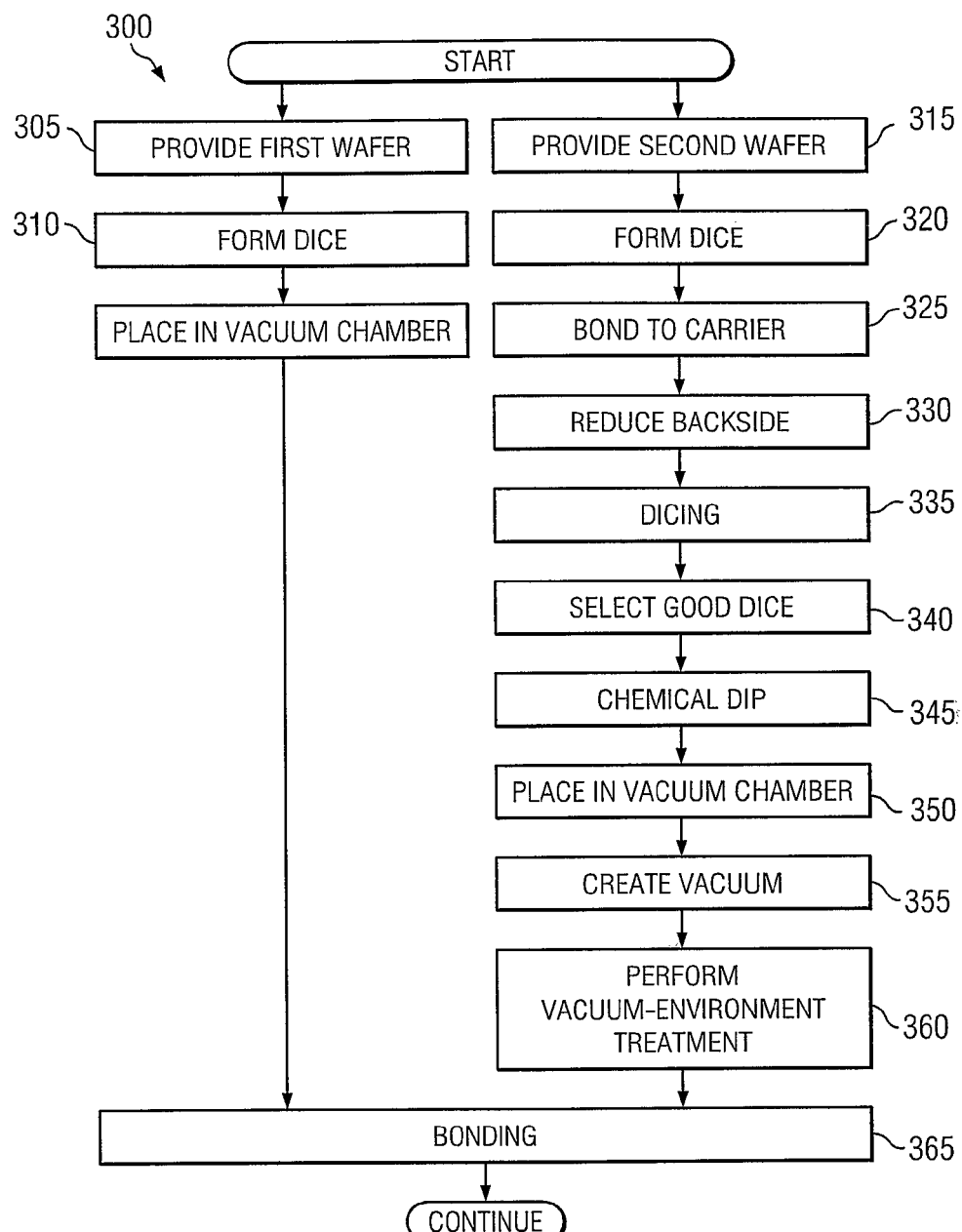
FIG. 6 is a flow diagram illustrating a method for fabricating a semiconductor device according to another embodiment of the present invention.

FIG. 6 is a flow diagram illustrating a method 300 for fabricating a semiconductor device according to another embodiment of the present invention. Again, at START, it is presumed that all of the materials and equipment necessary to performing the method are available and operational. A first wafer is provided (step 305), and populated with a plurality of dice (step 310). Note that although recited first, however, provision and population of the first wafer does not have to be started at any particular time, or finished before the wafer is actually needed. Note also that die formation, as discussed herein, is intended to refer generally to the formation of integrated circuits and related components on a wafer surface, or multiple wafer surfaces. Each die represents a semiconductor chip and contains the necessary circuitry for the chip's intended function.

The term chip will generally be used to refer to a completed die that has been separated from the others formed on the wafer, although this is not a strict requirement. That is, some operations in the methods of the present invention may be performed either before or after dicing, that is, before or after separating the dice on the wafer into individual chips. The choice of terms, however, is not meant to imply a requirement that a given operation must be performed at a specific time or that several operations must be performed in a particular order. Although the chips produced from a single wafer are usually identical or substantially identical with respect to each other, this is not required. Here, the plural "dice" includes one die; a wafer may contain only one chip, although this would not usually be the case.

A second wafer is also provided, (step 315) and populated with dice (step 320). The second wafer is then, in this embodiment, bonded to a carrier (step 325). This protects the surface upon which the integrated circuits are formed and leaves exposed the opposite, or what will be referred to as the backside of the wafer. The unprotected backside surface is then reduced (step 330). This backside reduction thins the wafer, and may expose conductors disposed beneath the original backside surface, such as conductor-filled vias that are typically formed only part way through the wafer. This backside reduction may include, for example, grinding, CMP (chemical-mechanical polishing), and etching, although these steps are not separately shown. The surface may be etched back such that the via conductors, if present, actually protrude slightly from the surface.

In the embodiment of FIG. 6, the dice are then diced into individual chips (step 335), for example by sawing, breaking, or laser etching. To hold the chips in place during this process, a tape may be used (step not separately shown). In this case, the wafer is mounted on a tape, and then the dice are sawed or broken apart but remained attached to the tape (which is removed at a later time). The good dice are then selected (step 340) through a process of inspection and testing, which is not shown and which may in fact involve several previously-performed operations. Those chips determined not to be good are then removed and discarded (also not shown). A chemical dip is then performed (step 345), and although this procedure is useful, it is optional and is not done in all embodiments. When performed, the chemical dip is to be done in a citric acid or, less preferably, in an HCl bath.

According to this embodiment of the present invention, the remaining chips of the second wafer are now placed in a vacuum chamber (step 350), and a vacuum environment is created (step 355). A vacuum-environment treatment is then performed (step 360). The vacuum-environment treatment, according to the present invention, includes one or more of an $H_2$-based thermal anneal, an $H_2$-based plasma treatment, or an $NH_3$-based plasma treatment. After the vacuum-environment treatment the first wafer is introduced into the vacuum chamber (step 360), preferably without breaking the vacuum. The chips (dice) of the first wafer are then bonded to the remaining (known good) chips of the second wafer (step 365).

Figure 7A:
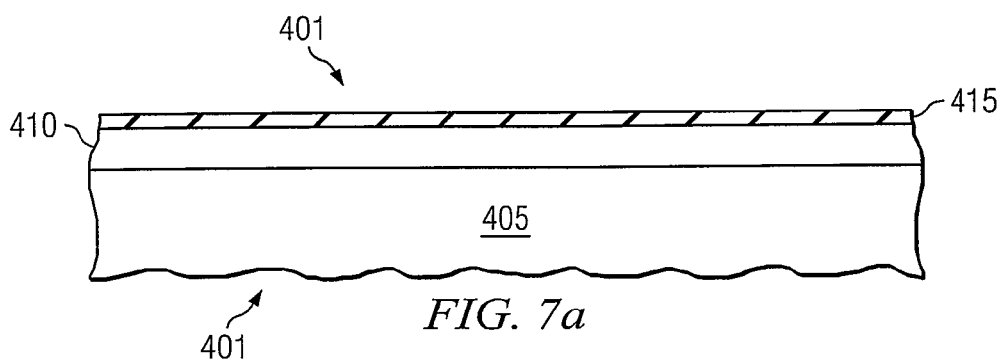
FIGS. 7a through 7h are a sequence of side views illustrating in cross-section the configuration of a semiconductor device at various stages of fabrication according to an embodiment of the present invention.

FIGS. 7a through 7h are a sequence of side views illustrating in cross section the configuration of a semiconductor device 400 at various stages of fabrication according to an embodiment of the present invention. FIG. 7a shows base wafer 401, which includes a substrate 405. An active area layer 410 is formed on the top surface of substrate 405. Note here that references to the top and bottom, or upper and lower portion of a given device are based on the orientation of the device in the figure being described. In actual use, or even during fabrication, the device may assume a number of different orientations. In this description, the term active area is generally used to describe those portions of the wafer upon which integrated circuits and related components have been formed, and includes both the individual electronic components that have been formed on and in the wafer surface and the layers of dielectric-embedded metal that interconnects these components. A first-wafer top dielectric layer 415 is separately illustrated, covering the active area layer 410. Note that active area layer 410 may, and in most current applications probably does, include a number of individual dice, which for simplicity are not separately illustrated here.

Figure 1:
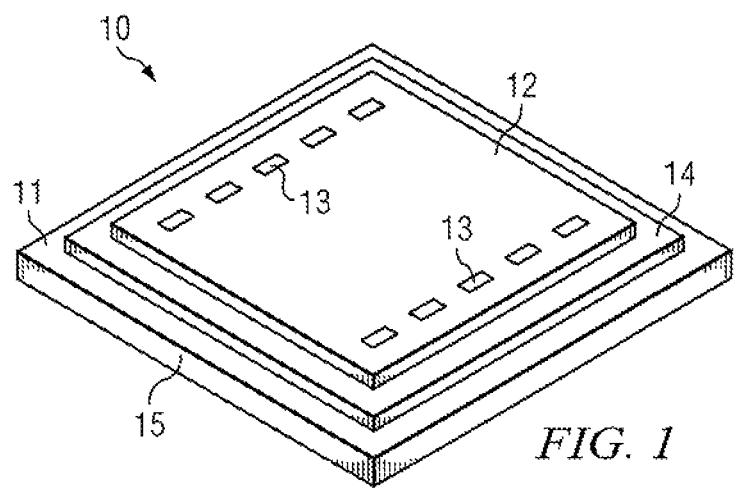
FIG. 1 is a simplified perspective view illustrating a typical semiconductor chip.
Figure 2:
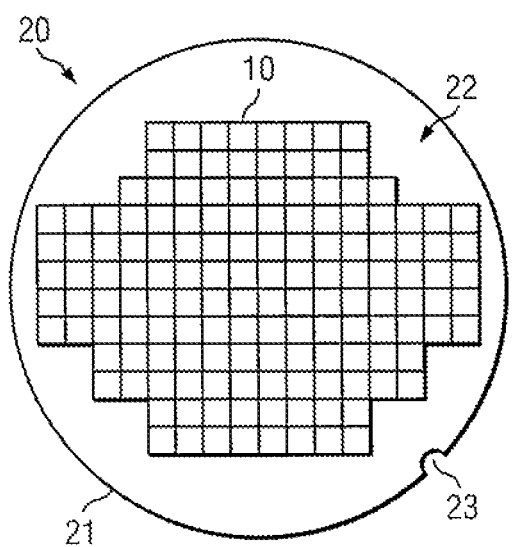
FIG. 2 is a plan view illustrating a typical semiconductor wafer.
Figure 3:
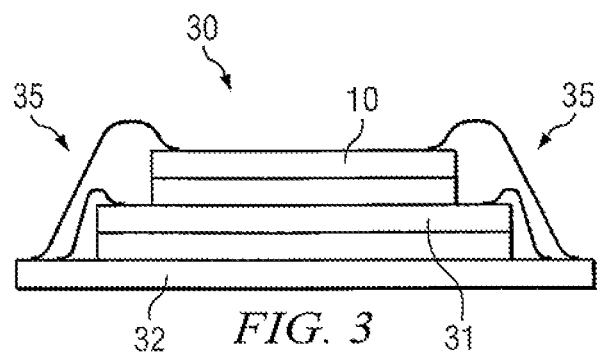
FIG. 3 is a simplified perspective view illustrating an exemplary 3D (three-dimensional)-SIC (stacked integrated circuit) semiconductor device.
Figure 7B:
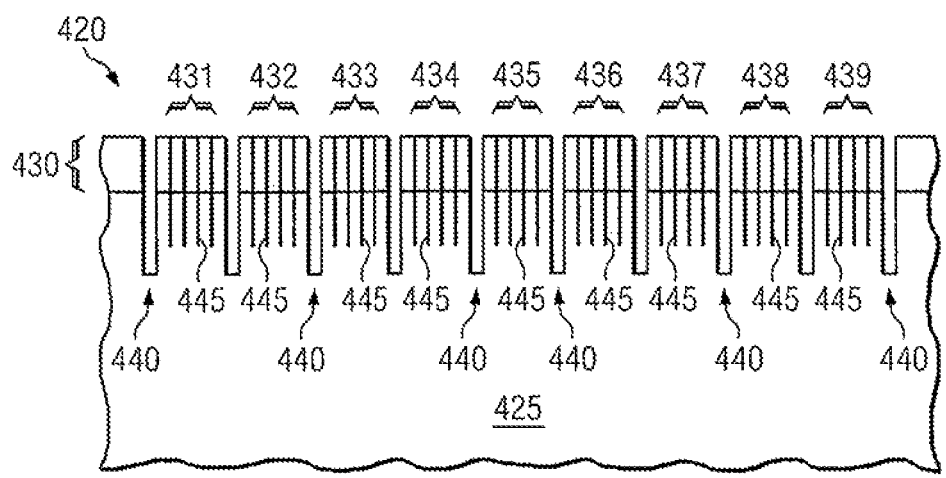

FIG. 7b shows a second semiconductor wafer 420, which in this embodiment includes a substrate 425 and an active area layer 430. In this case, the active area layer 430 includes a number of dice 431 through 439. Note that, for convenience, only a limited number of dice are illustrated; the typical wafer may have many more (see, for example, FIG. 1). In preparation for dicing, saw kerfs 440 have been made between each of the dice, through the active area layer 430 and extending into substrate 425. Also shown are a number of conductor-filled vias 445 extending from the active area layer 430 downward into the substrate 425. Each of these vias 445 is a slender, elongated recess that has been filled with a conductive material such as copper. Each is connected at its upper end with one or more components in the active area layer 430 (although, strictly speaking, there is no requirement that every one of the vias 445 be so connected). Note also that these figures are not necessarily drawn to scale.

Figure 7C:
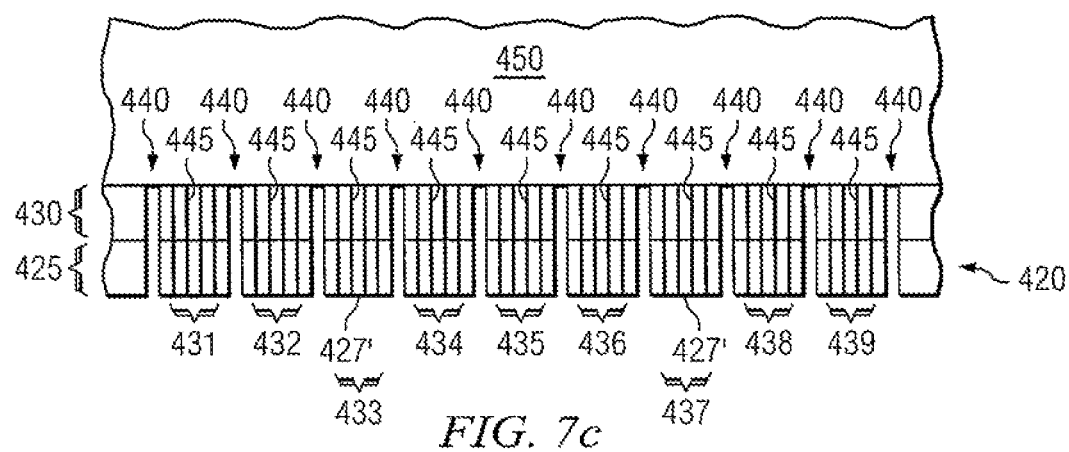
Figure 7D:
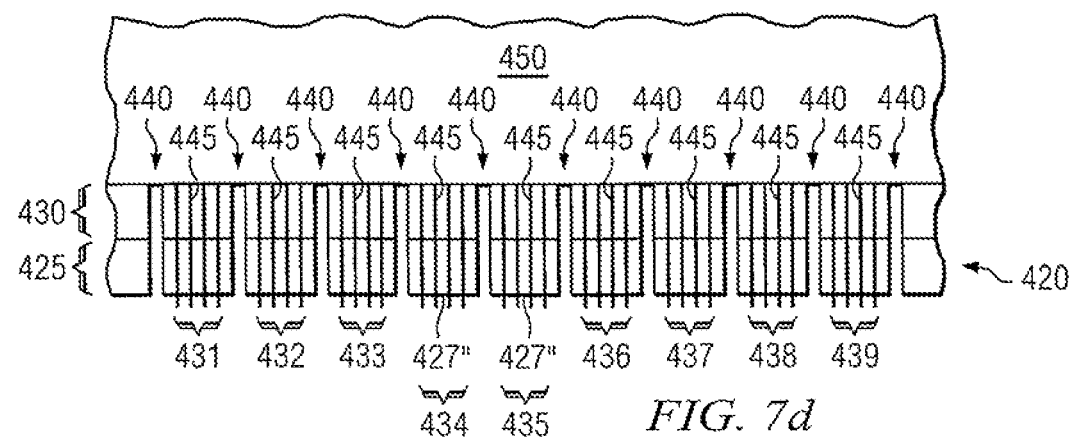

A carrier 450 is then mounted to the top of second semiconductor wafer 420. Carrier 450 may be any type of material on which the semiconductor wafer 420 maybe securely mounted and later removed. As should be apparent, carrier 450 helps to maintain the position stability of the different parts of second semiconductor wafer 420 during the operations that follow. In this embodiment, those operations now include a backside 427 reduction that, in effect, reduces the thickness of substrate 425. A CMP is then performed to expose the lower ends of the vias 445, as can be seen in FIG. 7c. The backside 427' may at this point be cleaned. An etching process is then performed in order to allow the lower ends of the vias 445 to protrude slightly from the further-reduced backside 427", as is shown in FIG. 7d (note that some reference numbers have been omitted for clarity).

Figure 7E:
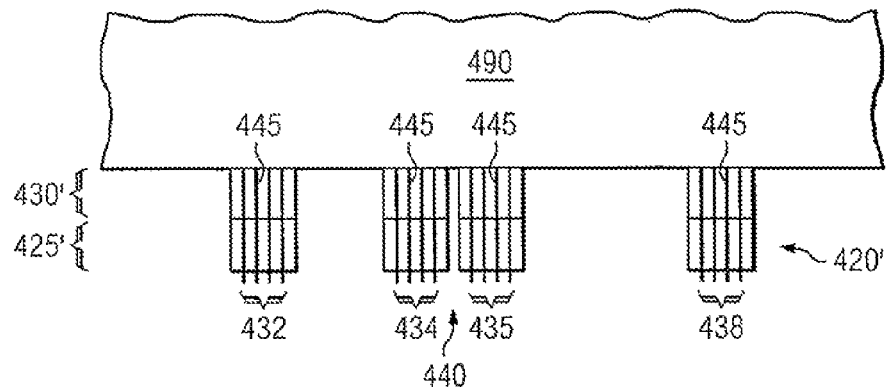

According to this embodiment, dicing now takes place to completely separate from each other the dice 431 through 439 of second semiconductor wafer 420. Stability and relative position of the dice may be maintained during this procedure by first mounting them on a tape or other structure to which they will adhere. The individual chips known to be good from previously-conducted testing are now selected, that is, the chips known not to be good are removed. A bonding tool 490 is attached to the remaining chips, in this illustration chip 432, 434, 435, and 438, as shown in FIG. 7e. A chemical dip may then be performed, for example using a citric acid or HCl bath, although the step is optional.

Figure 7F:
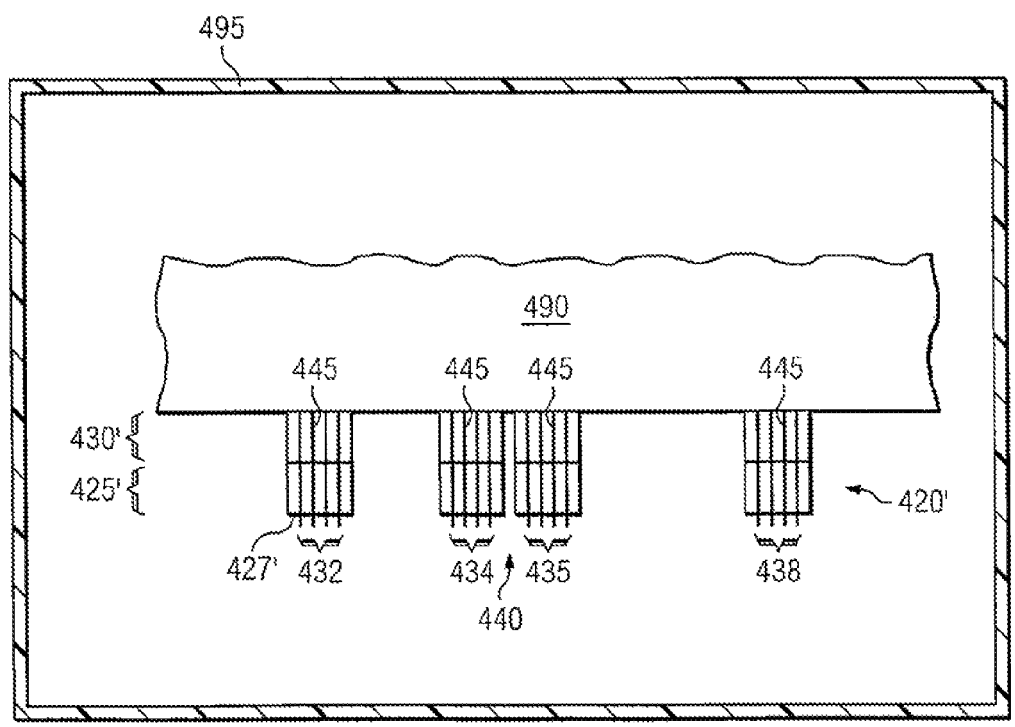
Figure 7G:
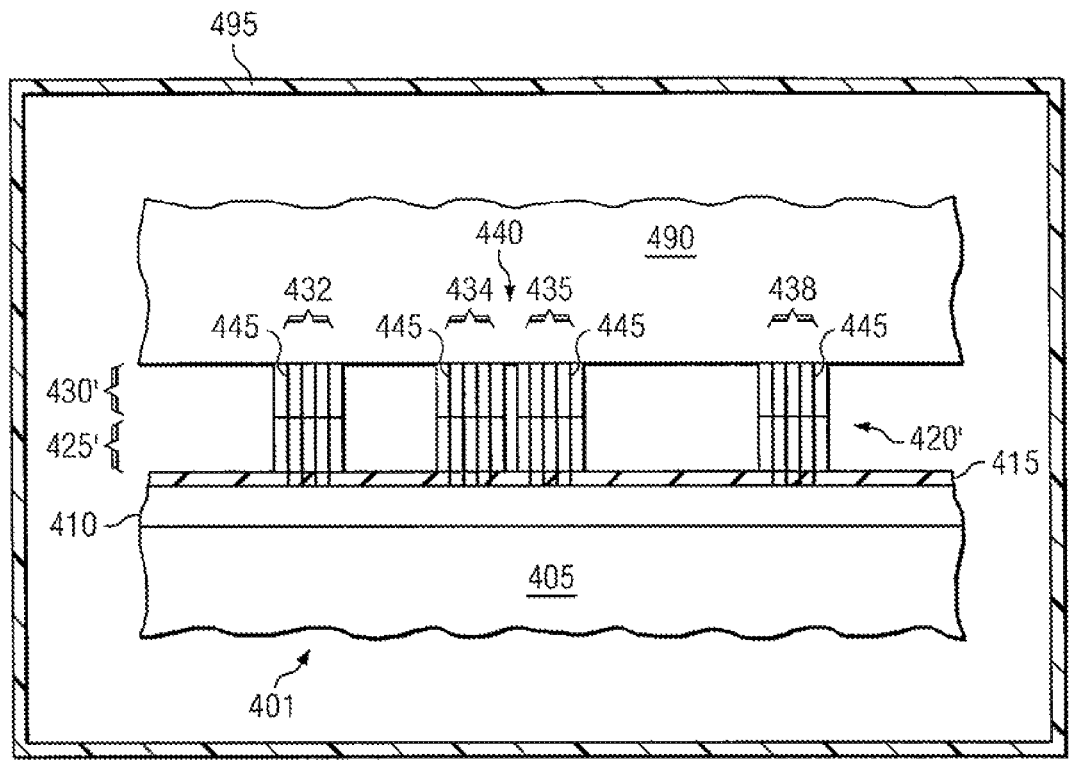

According to the embodiment of FIGS. 7a through 7h, the remaining chips 420' of second semiconductor wafer 420 are then placed in a vacuum chamber 495, as shown in FIG. 7f. A vacuum is drawn to create a vacuum environment, and then a vacuum-environment treatment is performed. As noted above, in accordance with the present invention, this vacuum-environment treatment includes one or more of an $H_2$-based thermal anneal, an $H_2$-based plasma treatment, or an $NH_3$-based plasma treatment. The base semiconductor wafer 410 is then introduced into the vacuum chamber 495, and the remaining semiconductor chips 420' may then be bonded to it, as shown in FIG. 7g. As should be apparent, each chip 432, 434, 435 and 439 is first aligned with an appropriate die or other location on the surface of base semiconductor wafer 410.

Figure 7H:
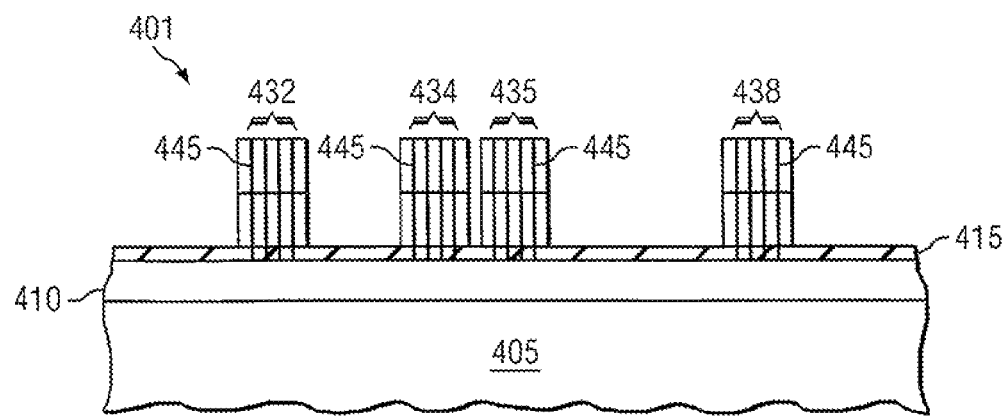

The semiconductor device 400 is then removed from the vacuum chamber 495, the bonding tool 490 is removed, and any necessary surface conditioning or cleaning may be performed at this time. The configuration of semiconductor device 400 at this point in the fabrication process is shown in FIG. 7h. The fabrication process may then continue with the fabrication of additional components, the separation of individual 3D-SIC devices, or other necessary operations. This may include, in some cases, the stacking and bonding of additional chips on top of those components already formed, although this is not illustrated here.

Note that the sequence of operations described above in reference to FIGS. 4 through 7h may be varied in any logically-permissible order. In addition, other operations may be added and, in some cases, existing operations removed, without deviating from the spirit of the invention. That is, although the present invention and its advantages have been described in detail, it should be understood that various changes, substitutions and alterations can be made herein without departing from the spirit and scope of the invention as defined by the appended claims. For example, the chemical dip prior to performing the selected vacuum-environment treatment may be omitted entirely. For another example, the good-die selection may be performed following the vacuum-environment treatment, or immediately after the chemical dip, if performed. And while it is preferred that the vacuum environment be maintained for as long as possible as the operations described above are performed, this is not a requirement of the invention unless explicitly stated, or apparent from the context.

In this way, among other advantages the chips of a 3D-SIC device may be more reliably bonded together and provide for a longer Q-time without significantly increasing the costs of production. Note that no particular result is required, however, unless explicitly recited for a particular embodiment.

Finally, note that the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for bonding, the method comprising:
   drawing a vacuum environment around a first semiconductor chip; and
   performing a vacuum-environment treatment comprising at least one of a hydrogen ($H_2$)-based thermal anneal, a hydrogen ($H_2$)-based plasma treatment, or an ammonia ($NH_3$)-based plasma treatment on the first semiconductor chip while the first semiconductor chip is in the vacuum environment; and
   bonding the first semiconductor chip with a second semiconductor chip.

2. The method of claim 1 further comprising placing the first semiconductor chip in a vacuum chamber before drawing the vacuum environment, the vacuum environment being drawn in the vacuum chamber.

3. The method of claim 2 further comprising moving the first semiconductor chip from the vacuum chamber into the vacuum environment prior to performing the vacuum-environment treatment.

4. The method of claim 1 further comprising placing the second semiconductor chip in a vacuum chamber, the vacuum environment being drawn around the first semiconductor chip in the vacuum chamber.

5. The method of claim 1, further comprising a chemical dip on the first semiconductor chip prior to the vacuum-environment treatment.

6. The method of claim 5, wherein the chemical dip includes citric acid.

7. The method of claim 5, wherein the chemical dip includes hydrochloric acid (HCl).

8. The method of claim 1, wherein the vacuum-environment treatment comprises the hydrogen ($H_2$)-based thermal anneal.

9. The method of claim 1, wherein the vacuum-environment treatment comprises the hydrogen ($H_2$)-based plasma treatment.

10. The method of claim 1, wherein the vacuum-environment treatment comprises the ammonia ($NH_3$)-based plasma treatment.

11. The method of claim 1 further comprising moving the first semiconductor chip from a treatment chamber into a bonding chamber prior to the bonding.

12. The method of claim 1, wherein the bonding the first semiconductor chip with the second semiconductor chip includes heating the first semiconductor chip and the second semiconductor chip.

13. The method of claim 1, wherein the bonding is performed after the performing the vacuum-environment treatment.

14. A method for bonding, the method comprising:
drawing a vacuum environment around a semiconductor wafer, the semiconductor wafer comprising a plurality of first semiconductor chips; and
performing a vacuum-environment treatment comprising at least one of a hydrogen ($H_2$)-based thermal anneal, a hydrogen ($H_2$)-based plasma treatment, or an ammonia ($NH_3$)-based plasma treatment on the first semiconductor chips while the first semiconductor chips are in the vacuum environment; and
bonding the first semiconductor chips with respective second semiconductor chips while maintaining the first semiconductor chips in the vacuum environment.

15. The method of claim 14 further comprising singulating the first semiconductor chips of the semiconductor wafer prior to bonding.

16. The method of claim 15 further comprising selecting only known good chips from the first semiconductor chips for the bonding.

17. The method of claim 16, wherein the vacuum environment treatment is performed on only the known good chips.

18. The method of claim 14 further comprising etching a bonding face of the first semiconductor chips to raise a profile of conductors to be bonded.

19. The method of claim 18 further comprising grinding and/or polishing the bonding face before the etching.

20. The method of claim 14, wherein the bonding is performed after the performing the vacuum-environment treatment.

* * * * *